(12) United States Patent
Lee et al.

(10) Patent No.: US 6,613,637 B1
(45) Date of Patent: *Sep. 2, 2003

(54) COMPOSITE SPACER SCHEME WITH LOW OVERLAPPED PARASITIC CAPACITANCE

(75) Inventors: Ming-Yi Lee, Fremont, CA (US); Chien-Hwa Chang, Cupertino, CA (US)

(73) Assignee: LSI Logic Corporation, Milpitas, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 10/160,812

(22) Filed: May 31, 2002

(51) Int. Cl.[7] ............................................. H01L 21/336
(52) U.S. Cl. ....................................................... 438/301
(58) Field of Search ................................ 438/301, 268, 438/287, 563, 591, 781, 778, 786, 787

(56) References Cited

U.S. PATENT DOCUMENTS

| | | | | |
|---|---|---|---|---|
| 5,510,281 A | * | 4/1996 | Ghezzo et al. | 438/268 |
| 6,107,667 A | * | 8/2000 | An et al. | 257/408 |
| 6,262,445 B1 | * | 7/2001 | Swanson et al. | 257/288 |
| 6,348,385 B1 | * | 2/2002 | Cha et al. | 438/287 |
| 6,351,016 B1 | * | 2/2002 | Huang et al. | 257/382 |
| 6,383,951 B1 | * | 5/2002 | Li | 438/781 |
| 6,437,377 B1 | * | 8/2002 | Ajmera et al. | 257/204 |

* cited by examiner

Primary Examiner—John F. Niebling
Assistant Examiner—Walter L. Lindsay, Jr.
(74) Attorney, Agent, or Firm—Beyer Weaver & Thomas LLP

(57) ABSTRACT

A method and composition for a composite spacer with low overlapped capacitance includes a low-k dielectric spacer layer. A first spacer is deposited on a partially formed semiconductor device having a gate oxide stack, followed by a low dielectric constant spacer layer. Anisotropic etching of the combined layers form spacers surrounding the gate oxide stack.

14 Claims, 3 Drawing Sheets

COMPOSITE SPACER SCHEME WITH LOW OVERLAPPED PARASITIC CAPACITANCE

BACKGROUND OF THE INVENTION

1. Field of the Invention

The present invention relates to techniques for forming silicon MOSFET devices having spacers. More particularly, the present invention relates to techniques for forming semiconductor devices having reduced overlapped capacitance between gate and source/drain regions in MOSFET devices.

2. Description of the Related Art

Semiconductor wafer fabrication involves a series of processes used to create semiconductor devices and integrated circuits (ICs) in and on a semiconductor wafer surface. Fabrication typically involves the basic operations of layering and patterning, together with others such as doping, and heat treatments. Layering is an operation used to add thin layers of material (typically insulator, semiconductor or conductor) to the surface of the semiconductor wafer. Layers are typically either grown (for example, thermal oxidation of silicon to grow a silicon dioxide dielectric layer) or deposited by a variety of techniques such as chemical vapor deposition (CVD) and physical vapor deposition (PVD), including evaporation and sputtering. Patterning, is an operation that is used to remove specific portions of the top layer or layers on the wafer surface. Patterning is usually accomplished through the use of photolithography (also known as photomasking) to transfer the semiconductor design to the wafer surface.

Semiconductor device sizes have decreased dramatically over the years. The downsizing of the devices has resulted in increased performance. In order to accommodate sub-micron IC feature sizes, various technologies have been developed and applied including thinner gate dielectrics and smaller gate dimensions. Each of these trends requires the solution of problems created by the miniaturization. For example, the investigation of exotic materials for the gate dielectric layers have resulted from the need to avoid problems such as tunneling inherent in thinner dielectrics. These new materials are difficult to manufacture. Moreover, severe problems, such as increased junction capacitance, arise from the shrinkage of junction depth for source/drain junctions into the sub 1000 Angstrom range.

Generally, the device performance is inversely proportional to the RC constant of the device, where R is the resistance of the gate and C is the intrinsic capacitance of the device. The capacitance is proportional to the dielectric constant and the area of the conductors but inversely proportional to the separation distance between the conductors. Thus, as the device dimensions decrease, so does the capacitance, resulting in faster device speeds.

As illustrated in FIG. 1, the intrinsic capacitance of an MOSFET device is a combination the junction capacitance ($C_j$) 102, gate capacitance ($C_g$) 104, overlapped capacitance in the drain region ($C_{op-d}$) 106, overlapped capacitance in the source region ($C_{op-s}$) 108, and gate to substrate capacitance ($C_{gb}$) 110. The overlapped capacitance is generally described as the capacitance arising from the overlap of the gate with the source or drain regions. Although device scaling increases device performance, further performance improvement can be obtained from reductions in overlapped capacitance. The more a device is scaled, the more intrinsic capacitance plays an important role in the device performance. In particular, since the overlap capacitance is not scaled with device size, its importance in device performance is critical. Thus, the benefit from the reduction of overlap capacitance is more obvious and dramatic.

Accordingly, it is desirable to increase the device performance without undertaking major processing equipment expenditures. It is desirable to increase the device performance by reducing the capacitance of the device, without requiring reduction of device dimensions.

SUMMARY OF THE INVENTION

To achieve the foregoing, the present invention provides a process for forming a Silicon MOSFET device having a reduced overlapped capacitance. The present invention exploits the fact that device performance may be increased by reducing the capacitance of the device without shrinking the device gate dimensions. In particular, a lower overlapped capacitance is obtained by forming a composite spacer. Reduced capacitance is obtained using a low dielectric constant material formed on an oxide or other isolation layer.

In one aspect, the invention provides a method of forming a semiconductor device having reduced overlapped capacitance. A silicon dioxide (SiO2) layer or other spacer isolation layer is deposited after etching of the gate. A low dielectric constant spacer material is deposited after deposition of the oxide layer. The layers are then etched anisotropically using an etch chemical selective to the low k spacer material and non selective to the isolation layer to form spacers having reduced overlapped capacitance.

In another aspect, the low k spacer material comprises silicon carbide and the isolation layer comprises silicon dioxide. The thickness of the spacer ($SiO_2$) isolation layer preferably is in the range from 50 to 300 Å, and more preferably 100 Å. The thickness of the SiC low k dielectric spacer material layer is preferably between about 500 to 1500 Å and more preferably 1000 Å.

In yet another aspect, the low k spacer material comprises silicon oxycarbide and the spacer isolation layer comprises silicon dioxide. The thickness of the spacer ($SiO_2$) isolation layer preferably is in the range from 50 to 300 Å, and more preferably 100 Å. The thickness of the silicon oxycarbide low k spacer material layer is preferably between about 300 to 1200 Å and more preferably 800 Å.

These and other features and advantages of the present invention are described below with reference to the drawings.

BRIEF DESCRIPTION OF THE DRAWINGS

FIGS. 2D'–2E' depict alternative stages in the method of forming a semiconductor device having a reduced overlapped capacitance in accordance with another embodiment of the present invention.

DETAILED DESCRIPTION OF PREFERRED EMBODIMENTS

Reference will now be made in detail to preferred embodiments of the invention. Examples of the preferred embodiments are illustrated in the accompanying drawings. While the invention will be described in conjunction with these preferred embodiments, it will be understood that it is not intended to limit the invention to such preferred embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The present invention provides a process for forming a semiconductor device having reduced overlapped capacitance. The present invention exploits the fact that device performance may be increased by reducing the capacitance of the device without shrinking the device gate dimensions. In particular, a lower overlapped capacitance is obtained by forming a composite spacer. Reduced capacitance is obtained using a low dielectric constant material formed on an oxide layer.

FIGS. 2A–2E depict stages in the method of forming a semiconductor device having a reduced overlapped capacitance in accordance with one embodiment of the present invention.

To isolate the active transistor areas different isolation techniques are employed to avoid electrical current leakage and malfunctioning of the device. The most important isolation techniques are LOCOS (Local Oxidation of Silicon) and STI (Shallow Trench Isolation). For deep-submicron technologies STI is more favorable because of less space consumption and less lateral encroachment. A conventional shallow trench isolation typically involves depositing an oxide layer on the surface of a semiconductor substrate, followed by deposition or formation of a nitride layer that is patterned to act as a mask for shallow trench etch. The nitride mask also has a role as a proper in-situ control layer for CMP, and preventing further oxidation of the substrate surface where it is masked. The next step involves etching of the shallow trench followed by formation of an oxide liner in the shallow trench. Following formation of the oxide liner, the trench is filled with deposited oxide, and the partly formed device is subjected to CMP to planarize down to the top of the trench and to the substrate layer adjacent to the trench.

Figure 2A:
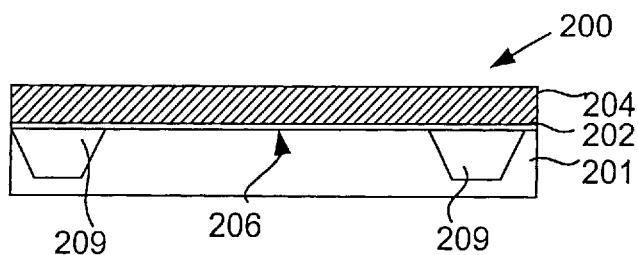
FIGS. 2A–2E depict stages in the method of forming a semiconductor device having a reduced overlapped capacitance in accordance with one embodiment of the present invention.

The process commences, according to one embodiment of the present invention and as illustrated in FIG. 2A, by forming polysilicon gate 208 between isolation regions 209 located on a silicon substrate 201 using conventional CMOS technology. In FIG. 2A, a portion of a semiconductor wafer 200 having a semiconductor substrate 201 (typically monocrystalline silicon) is shown. The substrate 201 has gate dielectric 202 and gate electrode 204 layers generated on its upper surface 206. The gate dielectric 202 and gate electrode 204 layers may be generated in ways well known to those of skill in the art. For example, the gate dielectric 202 may be silicon dioxide ($SiO_2$) grown by thermal oxidation of surface 206 of the silicon substrate 201 or deposited on the surface 206 by chemical vapor deposition (CVD). The gate electrode 204 may be polysilicon, for example, doped with n-type or p-type dopant atoms at about $10^{20}$ to $10^{21}$ $cm^{-3}$ deposited on the oxide to a thickness of about 800 to 3000 Å by, for example, CVD.

Figure 2B:
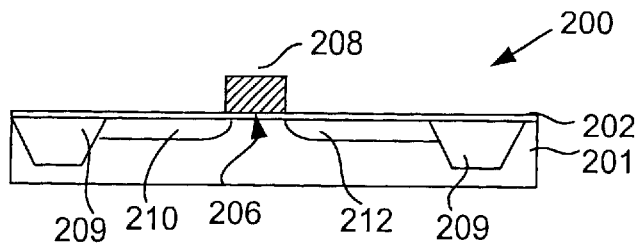

FIG. 2B shows the wafer 200 after the poly gate electrode layer 204 has been patterned and etched to form a polysilicon gate 208 according to methods well known in the art. The gate length is dependent upon the current process technology. Although the invention is applicable to any gate dimensions, smaller gate dimensions benefit more from the reduction in overlap capacitance. As the invention finds special application in deep sub-micron technologies, the length of gate electrode 208 is preferably no more than about 0.50 microns, more preferably no more than about 0.18 microns, and most preferably no more than about 0.09 microns.

Ion implant procedures may be used to dope portions of the substrate 201 adjacent to the gate 208 in order to create source 210 and drain 212 regions. For example, the substrate 201 may be n- or p-doped at a concentration of about $10^{20}$ to $10^{21}$ $cm^{-3}$ to a depth of about 0.05 to 0.2 micrometers below the substrate 201 surface. The source 210 and drain 212 regions may be complete as formed by this implant or may be completed by another ion implant step at a subsequent stage of the fabrication according to procedures well known in the art. For example, a second source/drain implant step may be performed after the stage illustrated in FIG. 2E wherein the spacers 218, in addition to the gate 208, may act as an ion implantation mask. It should be noted that the terms "source" and "drain" are used in a relative sense and may be interchanged.

Figure 2C:
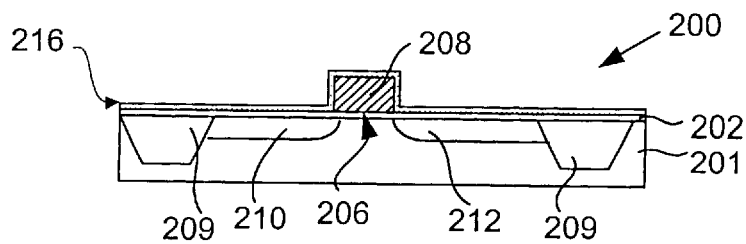

Next, an oxide dielectric layer (first spacer layer) 216 is conformably deposited over the wafer surface, covering both the gate dielectric 202 and the gate electrode 208, as shown in FIG. 2C. The first spacer layer 216 is preferably about 50 to 300 Å thick when the first spacer layer comprises silicon dioxide ($SiO_2$). The first spacer layer 216 may be deposited in ways well known to those of skill in the art. For example, the first spacer layer 216 may be deposited by LPCVD (Low-pressure chemical vapor deposition), RTP/CVD, or PECVD (Plasma Enhanced Chemical Vapor Deposition). Precursor chemicals may include $SiH_4$, $SiH_2Cl_2$, $N_2O$ or TEOS chemicals. The first spacer layer 216 material preferably includes silicon dioxide ($SiO_2$) or nitrided silicon dioxide.

The first spacer layer 216 functions to form the stress relief buffer between the silicone substrate 201 and a subsequently deposited low dielectric constant material. The first spacer layer 216 also serves as a hot electron carrier barrier to improve device reliability.

Figure 2D:
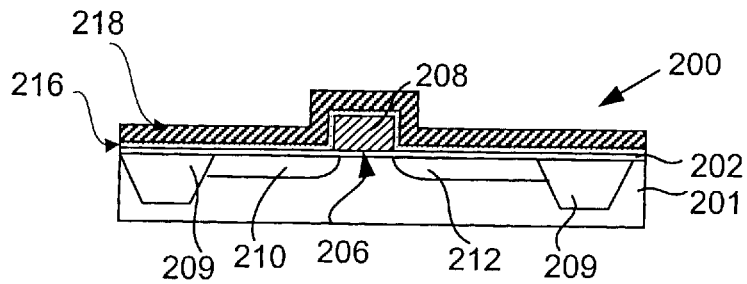

As illustrated in FIG. 2D, a low dielectric constant spacer material (low-k spacer) 218 is deposited on first spacer layer 216. Suitable dielectric constant values would include those less than k=7, preferably less than k=5. Conventional processing schemes form dielectrics having higher k values, such as, for example, dielectrics formed of silicon nitride, which have dielectric constants of approximately 7. Preferably the low-k spacer 218 will have etching characteristics different from $SiO_2$ in order for plasma dry etch or wet etch to be applied without causing punch through of the oxide 208 which might cause damages to the device. It is generally preferred that the first spacer layer 216 and the low-k spacer 218 have highly selective etch rates so as to ensure that the finished spacer is not etched away in a subsequent wet etch or clean process.

Examples of suitable materials for the low-k spacer layer include amorphous silicon carbide (SiC) and silicon oxycarbide ($SiO_xC_y$). Suitable dielectric materials will exhibit low K characteristics in conjunction with high etch selectivity in comparison to the underlying oxide layer (first spacer layer). Silicon carbide materials have dielectric constants reported in the range of k=4.2 to 5 and a very high selective etch rate in comparison to silicone dioxide. For example, the HF wet etch rate is 1:20 (SiC:SiO2). Silicon carbide, in particular, may be deposited with various techniques such as PECVD, ozone assisted CVD, and LPCVD. Other suitable materials include amorphous silicon oxycarbide ($SiO_xC_y$). Silicon-oxycarbide has a reported dielectric constant of k=4.2 to 5.2 and similar etch characteristics and other chemical properties to SiC.

Generally, in accordance with the various embodiments of the present invention, the low-k spacer will have a reduced k value in comparison to traditional spacers (i.e. less than the k=7 value used for SiN) and will have etch characteristics selective to the downstream process such as wet etching or plasma etching. Many materials will present better dielectric constant (k) values but sacrifice selectivity. For example, low k material layers having a high selectivity may permit the first spacer layer (e.g. $SiO_2$) to be thinned down considerably. Generally a higher oxygen content in the low-k spacer will lower the k but at a sacrifice to the etching selectivity. In specific embodiments, $SiO_2$ or a nitrided $SiO_2$ are used in the first spacer layer (and may also be used in the second spacer layer as described with reference to FIG. 2D' below). These materials are intended to be exemplary and not limiting. The invention is intended to cover all combinations of materials in the 2 or 3 layers forming the composite spacer layers where a reduced dielectric constant and reduced overlapped capacitance results and wherein the dielectric constant material has a different etching selectivity than the underlying isolation layer.

The low-k spacer comprises, in one embodiment, silicon carbide and the first spacer layer comprises silicon dioxide. The thickness of the $SiO_2$ first spacer layer preferably is in the range from 50 to 300 Å, and more preferably 100 Å. The thickness of the SiC low-k spacer layer is preferably between about 500 to 1500 Å and more preferably 1000 Å. Where silicon oxycarbide is used for the low-k spacer layer, the thickness of the layer is preferably between about 300 to 1200 Å and more preferably 800 Å.

Figure 2E:
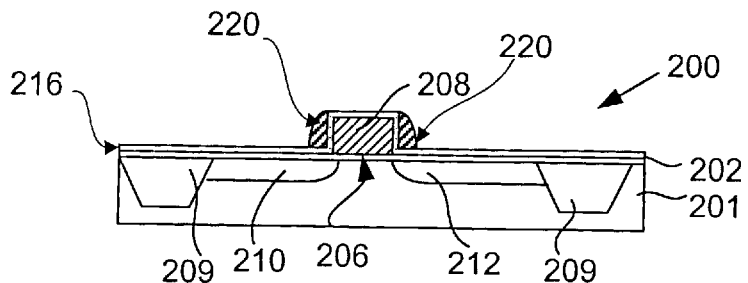
Figure 2D:
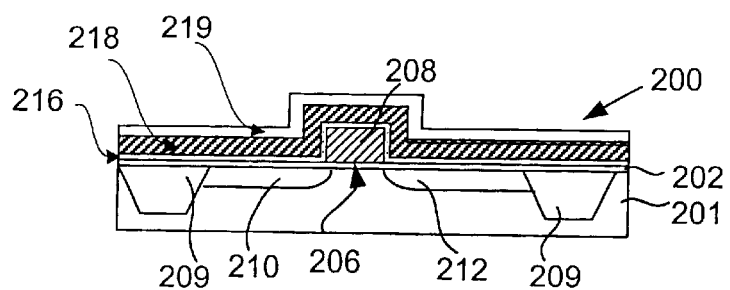
Figure 2E:
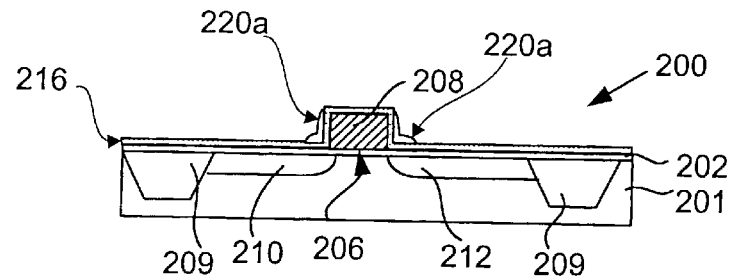

As shown in FIG. 2E, the composite layer formed by the low-k spacer 218 and the first spacer layer 216 on all exposed horizontal surfaces is then removed. This removal may be accomplished, for example, by an anisotropic etch performed under conditions well known in the art. The composite layers of low-k dielectric spacer layer 218 and first spacer layer 216 remaining after the anisotropic etch step provides vertical spacers 220, as illustrated in FIG. 2E. The spacers 220, together with the remaining gate oxide 202, separate the poly gate electrode 208 from the source 210 and drain 212 regions.

A highly selective plasma etch process may be used to form the spacer. The plasma etch rate, for example, may be tuned from 20:1 to 5:1 depending on the chemicals used, plasma bias power condition and reaction chamber pressure. For example, the 5:1 etch rate is typical for a Fluorine based chemistry process whereas the 20:1 etch rate is typical for a Hydrochloride based chemistry process. Ideally the spacer etch process is tuned to remove the low-k spacer layer 218 and stop on the first spacer layer 216 without punching through the gate oxide.

After the spacer 220 formation, a deep junction may be formed by implanting various species of BF2 or B11 to form a p-channel junction. N-channel junctions are formed by implanting As or phosphorus. To form the silicide contact the remaining oxide is removed by wet etch or plasma dry etch. The high selective etch rates between the first spacer layer 216 and the low-k spacer layer 218 permits the remaining oxide to be removed by wet etch or plasma dry etch. For example, in a plasma dry etch, typical chemicals such as the fluorine based $CF_4$ or $CHF_3$, may be used. These chemicals have the characteristic of etching SiC at a slower rate then $SiO_2$. The selective etch rate is about 5:1 (SiC:SiO2). Again, these parameters allow the SiC low-k spacer 220 to be preserved after the etching step.

According to conventional techniques, after the silicide contact formation, the contact metal line and passivation layers may be formed to complete a device circuit.

FIGS. 2D' and 2E' illustrate alternative stages which may be used to produce a spacer configured in an "L" shape, in accordance with another embodiment of the present invention. As illustrated in FIG. 2D', after depositing the low k spacer material 218, a second oxide (spacer) layer 219 is deposited. Accordingly a composite spacer layer comprised of a first spacer layer 216, the low-k dielectric spacer layer 218, and the second spacer layer 219 is used to form the desired spacer 220a as illustrated in FIG. 2E'. Preferably the first spacer layer 216 will have a thickness between 50 and 300 Å, more preferably 100 Å. In this embodiment, the low-k spacer layer will have a thickness between 300 and 800 Å, more preferably 500 Å, for example, when SiC is used as the low-k material. The second spacer layer 219 will preferably have a thickness between 200 and 800 Å, more preferably 400 Å. The second spacer layer may comprise any materials suitable for the first spacer layer or the low-k spacer layer, such as, for example, SiO2, nitrided SiO2, silicon carbide (SiC) or silicon oxycarbide ($SiO_xC_y$).

Simulation Results

Figure 1:
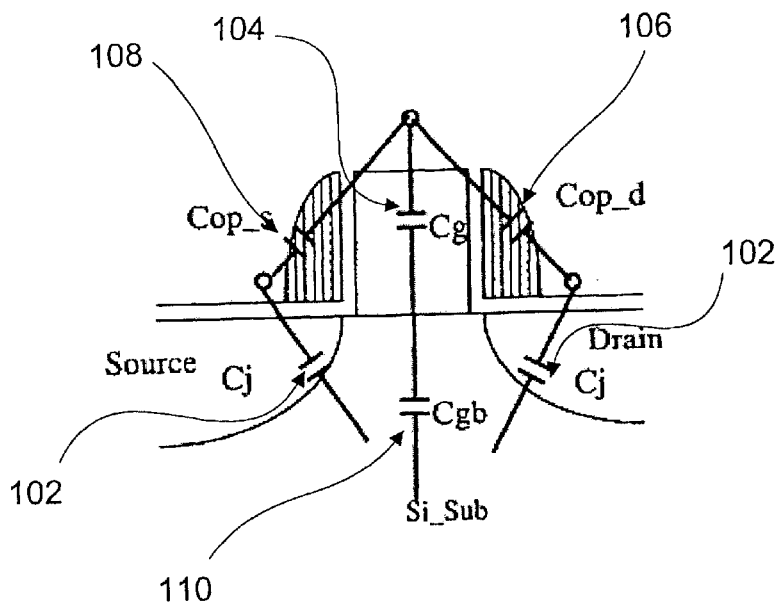
FIG. 1 illustrates a schematic of intrinsic MOSFET capacitance.
Figure 3:
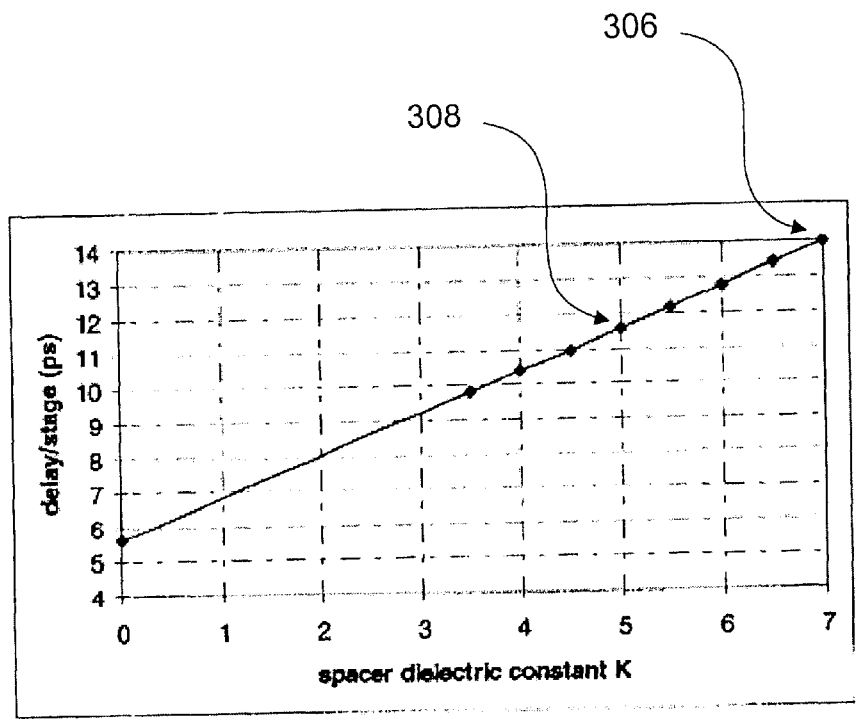
FIG. 3 is a graphical plot illustrating the device performance increase shown in simulation in accordance with one embodiment of the present invention.

The reduced overlapped capacitance produced by techniques of the present invention have generated pronounced improvements (reductions) in transistor delay times as simulated on HSPICE simulation tools. More particularly, a 0.13 micron SPICE model (HP Rev. 1.5) was used to demonstrate the device performance improvement using the new reduced overlapped capacitance. The HSPICE simulation tool modeled the performance of the spacer dielectric constant as implemented in a 113-stage ring oscillator simulated circuit. For purposes of the simulation, reductions in the spacer dielectric were assumed to affect only the overlapped capacitance and not other capacitance values. DC performance was assumed to remain unchanged. FIG. 3 illustrates the HSPICE simulation performance results. The k values shown along the x-axis correspond to values of the dielectric constant for the composite spacer. For example, point 306 indicates a dielectric constant value of 7, which is typical of conventional spacers fabricated using silicon nitride. For a further example, point 308 indicates a composite spacer dielectric constant of 5.0, for example, available from the use of amorphous silicon carbide in accordance with techniques described in embodiments of the present invention. Thus the performance improvement, represented by the delay per stage from 14 ps to 11.59 ps, (as shown along the y-axis in FIG. 3) is approximately 17%.

The techniques described in the embodiments of the invention are applicable to the formation of spacers in all MOS devices including NMOS, PMOS and CMOS. They are particularly useful for sub half-micron (less than 0.50 micron) process technologies. As these device sizes shrink, the use of reduced overlapped capacitance through the formation of composite spacers such as illustrated by layers 208 and 210 in FIG. 2a is expected to offer a low cost alternative to device scaling for improved performance. Thus, the composite spacer layers having a low dielectric constant and suitable etch characteristics in comparison to the underlying isolation layer will avoid many of the problems associated with device miniaturization.

Although the foregoing invention has been described in some detail for purposes of clarity of understanding, it will be apparent that certain changes and modifications may be practiced within the scope of the appended claims. For example, the process of the present invention is applicable to any scheme where a composite layer is formed to produce reduced parasitic overlapped capacitance. Accordingly, the present embodiments are to be considered as illustrative and not restrictive, and the invention is not to be limited to the details given herein, but may be modified within the scope and equivalents of the appended claims.

What is claimed is:

1. A method of forming a composite spacer in a semiconductor device, the method comprising:

forming a first spacer layer on a partially formed semiconductor device having a gate oxide stack;

depositing a low dielectric constant spacer layer comprising silicon oxycarbide ($SiO_xC_y$) on top of the first spacer layer; and anisotropically etching the low dielectric constant spacer layer and stopping on the first spacer layer to form spacers surrounding the gate oxide stack.

2. The method described in claim 1, wherein the first spacer layer is one of silicon dioxide ($SiO_2$) and nitrided silicon dioxide.

3. The method described in claim 1 further comprising depositing a second spacer layer on the low dielectric constant spacer layer before anisotropically etching, and wherein the anisotropic etching etches both the second spacer layer and the low dielectric constant spacer layer and stops on the first spacer layer.

4. The method described in claim 3, wherein the second spacer layer is one of $SiO_2$ ($SiO_2$) and nitrided silicon dioxide.

5. The method described in claim 1, wherein the low dielectric constant spacer layer has a k value of less than 7.

6. The method described in claim 1, wherein the anisotropic etching is performed using plasma etching.

7. The method described in claim 1 wherein the first spacer layer has a deposited thickness in the range of 50 to 300 Å and the low dielectric constant spacer layer has a thickness in the range of 500 to 1500 Å.

8. The method described in claim 7, wherein the first spacer layer comprises $SiO_2$.

9. The method described in claim 3 wherein the first spacer layer has a deposited thickness in the range of 50 to 300 Å, the low dielectric constant spacer layer has a thickness in the range of 300 to 800 Å, and the second spacer layer has a deposited thickness in the range of 200 to 800 Å.

10. The method described in claim 9, wherein the first and second spacer layers comprise $SiO_2$.

11. A method of forming a composite spacer in a semiconductor devices the method comprising:

forming a first spacer layer comprising nitrided silicon dioxide on a gate oxide stack;

depositing a low dielectric constant spacer layer on top of the first spacer layer; and anisotropically etching the low dielectric constant spacer layer and stopping on the first spacer layer to form spacers surrounding the gate oxide stack.

12. The method described in claim 11, wherein the low dielectric constant spacer layer is one of silicon carbide (SiC) and silicon oxycarbide ($SiO_xC_y$).

13. The method described in claim 11 further comprising depositing a second spacer layer on the low dielectric constant spacer layer before anisotropically etching, and wherein the anisotropic etching etches both the second spacer layer and the low dielectric constant spacer layer.

14. The method described in claim 13 wherein the second spacer layer comprises silicon oxycarbide ($SiO_xC_y$).

* * * * *